(12) United States Patent
Yu et al.

(10) Patent No.: US 10,056,328 B2
(45) Date of Patent: Aug. 21, 2018

(54) RUTHENIUM METAL FEATURE FILL FOR INTERCONNECTS

(71) Applicant: Tokyo Electron Limited, Minato-ku, Tokyo (JP)

(72) Inventors: Kai-Hung Yu, Watervliet, NY (US); Gerrit J. Leusink, Rexford, NY (US); Cory Wajda, Sand Lake, NY (US); Tadahiro Ishizaka, Hokuto (JP); Takahiro Hakamata, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 2 days.

(21) Appl. No.: 15/651,979

(22) Filed: Jul. 17, 2017

(65) Prior Publication Data

US 2017/0317022 A1   Nov. 2, 2017

Related U.S. Application Data

(63) Continuation of application No. 15/172,648, filed on Jun. 3, 2016, now Pat. No. 9,711,449.

(60) Provisional application No. 62/171,739, filed on Jun. 5, 2015.

(51) Int. Cl.
| | |
|---|---|
| *H01L 21/768* | (2006.01) |
| *H01L 23/522* | (2006.01) |
| *H01L 23/532* | (2006.01) |
| *H01L 21/285* | (2006.01) |

(52) U.S. Cl.
CPC .... *H01L 23/5226* (2013.01); *H01L 21/76814* (2013.01); *H01L 21/76826* (2013.01); *H01L 21/76879* (2013.01); *H01L 21/76882* (2013.01); *H01L 23/53242* (2013.01); *H01L 21/28556* (2013.01); *H01L 21/28562* (2013.01); *H01L 21/76876* (2013.01)

(58) Field of Classification Search
CPC ....... H01L 21/70; H01L 21/702; H01L 21/71; H01L 21/77
See application file for complete search history.

(56) References Cited

U.S. PATENT DOCUMENTS

| | | | |
|---|---|---|---|
| 8,517,769 | B1 | 8/2013 | Lin et al. |
| 2002/0179954 | A1 | 12/2002 | Joo et al. |
| 2003/0032238 | A1 | 2/2003 | Kim et al. |
| 2003/0139033 | A1 | 7/2003 | Gardner |
| 2006/0110530 | A1 | 5/2006 | Suzuki et al. |
| 2006/0246217 | A1* | 11/2006 | Weidman ............... B82Y 30/00 427/99.5 |
| 2007/0059502 | A1 | 3/2007 | Wang et al. |
| 2009/0065939 | A1 | 3/2009 | Suzuki |

(Continued)

FOREIGN PATENT DOCUMENTS

JP   2010199349 A   9/2010

OTHER PUBLICATIONS

Korean Intellectual Property Office (KIPO), International Search Report and Written Opinion for related International application No. PCT/US2016/035724, dated Aug. 30, 2016, 11 pages.

(Continued)

*Primary Examiner* — Cheung Lee

(57) ABSTRACT

A method is provided for at least partially filling a feature in a substrate. The method includes providing a substrate containing a feature, depositing a ruthenium (Ru) metal layer to at least partially fill the feature, and heat-treating the substrate to reflow the Ru metal layer in the feature.

19 Claims, 3 Drawing Sheets

(56) References Cited

U.S. PATENT DOCUMENTS

| | | |
|---|---|---|
| 2009/0130843 A1 | 5/2009 | Suzuki |
| 2010/0107927 A1 | 5/2010 | Stewart et al. |
| 2010/0216305 A1 | 8/2010 | Wada |
| 2010/0285660 A1* | 11/2010 | Lin .......................... C25D 5/02 438/650 |
| 2012/0205804 A1 | 8/2012 | McFeely et al. |
| 2014/0008812 A1 | 1/2014 | Emesh |

OTHER PUBLICATIONS

Taiwan Intellectual Property Office (TIPO), Notification of a First Office Action for related Taiwan patent application No. 105117505, dated Mar. 7, 2017, 9 pages.

* cited by examiner

CD width measurement after performing oxide backfill twice

| No. | Chip No. | 50nm Width (nm) | 56nm Width (nm) | 64nm Width (nm) | 80nm Width (nm) |
|---|---|---|---|---|---|
| 1 | 00,00 | 11.55 | 13.99 | 18.04 | 28.97 |
| 2 | -1,00 | 11.57 | 13.98 | 18.07 | 28.95 |
| 3 | -2,00 | 11.22 | 13.48 | 17.30 | 29.15 |
| 4 | -3,00 | 11.08 | 13.14 | 16.68 | 27.13 |
| 5 | -4,00 | 11.09 | 13.40 | 17.33 | 28.62 |
| 6 | -5,00 | 11.12 | 13.31 | 17.09 | 27.92 |
| Maximum | | 11.57 | 13.99 | 18.07 | 29.15 |
| Minimum | | 11.08 | 13.14 | 16.68 | 27.13 |
| Mean | | 11.27 | 13.55 | 17.42 | 28.46 |
| Max-Min | | 0.49 | 0.85 | 1.39 | 2.02 |
| 3 Sigma | | 0.69 | 1.07 | 1.64 | 2.35 |

| | Feature Diameter |
|---|---|
| 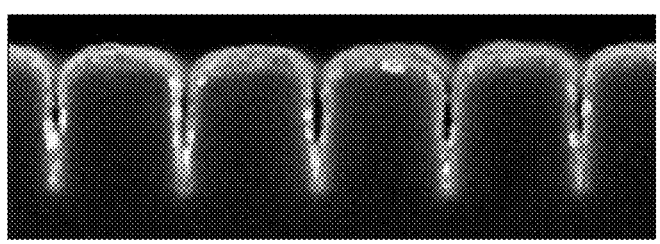 | 28.5nm |
| 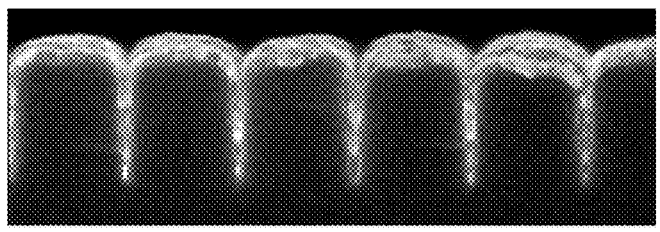 | 17.4nm |
| 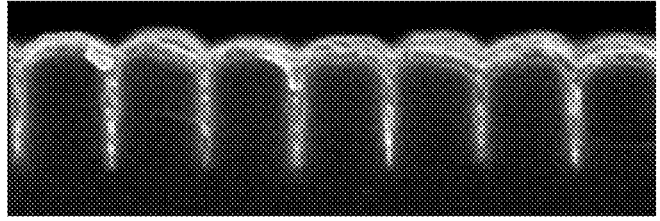 | 11.5nm |
*FIG. 3A*
| | Feature Diameter |
|---|---|
| 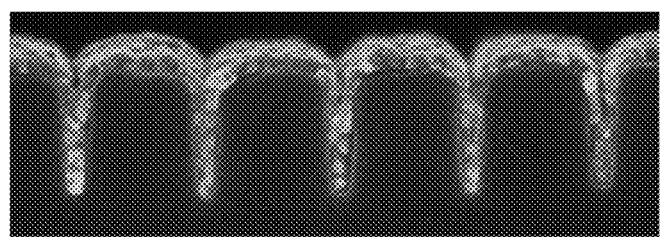 | 28.5nm |
| 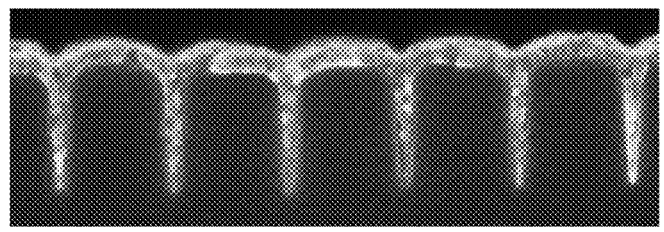 | 17.4nm |
| 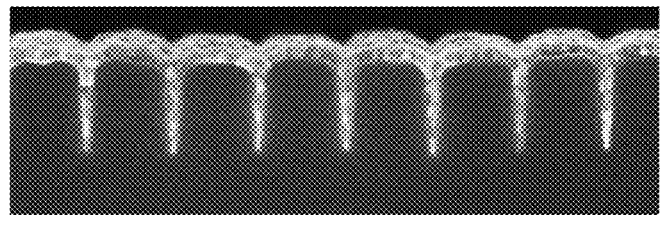 | 11.5nm |
*FIG. 3B*

RUTHENIUM METAL FEATURE FILL FOR INTERCONNECTS

CROSS-REFERENCE TO RELATED APPLICATIONS

This application is a continuation of co-pending U.S. patent application Ser. No. 15/172,648, filed on Jun. 3, 2016, which is related to and claims priority to U.S. Provisional Application No. 62/171,739, filed Jun. 5, 2015. The entire contents of these applications are herein incorporated by reference in their entirety.

FIELD OF THE INVENTION

The present invention relates to methods for void-less filling of features such as vias and trenches with low resistivity ruthenium (Ru) metal for microelectronic devices.

BACKGROUND OF THE INVENTION

An integrated circuit contains various semiconductor devices and a plurality of conducting metal paths that provide electrical power to the semiconductor devices and allow these semiconductor devices to share and exchange information. Within the integrated circuit, metal layers are stacked on top of one another using intermetal and interlayer dielectric layers that insulate the metal layers from each other.

Normally, each metal layer must form an electrical contact to at least one additional metal layer. Such electrical contact is achieved by etching a feature (i.e., a via) in the interlayer dielectric that separates the metal layers, and filling the resulting via with a metal to create an interconnect. Metal layers typically occupy etched pathways in the interlayer dielectric. A "via" normally refers to any feature such as a hole, line or other similar feature formed within a dielectric layer that provides an electrical connection through the dielectric layer to a conductive layer underlying the dielectric layer. Similarly, metal layers connecting two or more vias are normally referred to as trenches.

The use of copper (Cu) metal in multilayer metallization schemes for manufacturing integrated circuits creates problems due to high mobility of Cu atoms in dielectrics, such as $SiO_2$, and Cu atoms may create electrical defects in Si. Thus, Cu metal layers, Cu filled trenches, and Cu filled vias are normally encapsulated with a barrier material to prevent Cu atoms from diffusing into the dielectrics and Si. Barrier layers are normally deposited on trench and via sidewalls and bottoms prior to Cu seed deposition, and may include materials that are preferably non-reactive and immiscible in Cu, provide good adhesion to the dielectrics and can offer low electrical resistivity.

An increase in device performance is normally accompanied by a decrease in device area or an increase in device density. An increase in device density requires a decrease in via dimensions used to form interconnects, including a larger aspect ratio (i.e., depth to width ratio). As via dimensions decrease and aspect ratios increase, it becomes increasingly more challenging to form diffusion barrier layers with adequate thickness on the sidewalls of the vias, while also providing enough volume for the metal layer in the via. In addition, as via and trench dimensions decrease and the thicknesses of the layers in the vias and trenches decrease, the material properties of the layers and the layer interfaces become increasingly more important. In particular, the processes forming those layers need to be carefully integrated into a manufacturable process sequence where good control is maintained for all the steps of the process sequence.

The problems associated with the use of Cu metal in increasingly smaller features in a substrate will require replacing the Cu metal with other low-resistivity metals.

SUMMARY OF THE INVENTION

A method is provided for void-less Ru metal feature fill for interconnects in a microelectronic device.

According to an embodiment of the invention, method is provided for at least partially filling a feature in a substrate by providing a substrate containing a feature, depositing a ruthenium (Ru) metal layer to at least partially fill the feature, and heat-treating the substrate to reflow the Ru metal layer in the feature.

According another embodiment, a method is provided for filling a feature in a substrate by providing a substrate containing a feature, depositing a conformal ruthenium (Ru) metal layer that fills the feature, and heat-treating the substrate to reflow the conformal Ru metal layer in the feature, where the conformal Ru metal layer has seam voids in the feature and the heat-treating seals the seam voids and increases the grain size of the conformal Ru metal layer in the feature.

According to yet another embodiment of the invention, a method is provided for at least partially filling a feature in a substrate by providing a substrate containing a feature formed in a dielectric layer on the substrate, forming a nucleation layer in the feature, depositing a conformal ruthenium (Ru) metal layer on the nucleation layer to at least partially fill the feature, and heat-treating the substrate to reflow the conformal Ru metal layer in the feature, where the heat-treating reduces voids in the feature fill and increases the grain sizes of the conformal Ru metal layer in the feature.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 2A and 2B show cross-sectional and top view scanning electron microscopy (SEM) images of the features in a substrate used for Ru metal film filling according to an embodiment of the invention;

FIG. 3A shows cross-sectional SEM images of Ru metal deposition in narrow features in a substrate according to an embodiment of the invention;

FIG. 3B shows cross-sectional SEM images of Ru metal deposition in narrow features in a substrate according to an embodiment of the invention;

DETAILED DESCRIPTION OF SEVERAL EMBODIMENTS

Methods for void-less filling of features with low resistivity Ru metal for microelectronic devices are described in several embodiments.

According to one embodiment, a method is provided for at least partially filling a feature in a substrate. The method includes providing a substrate containing a feature, depositing a Ru metal layer to at least partially fill the feature, and heat-treating the substrate to reflow the Ru metal layer in the feature. The at least partial filling takes advantage of capillary action to pull heat-softened Ru metal down into very narrow features and recrystallization of the Ru metal to form larger Ru metal grains. The inventors have discovered that this unique and unexpected result of low temperature Ru metal recrystallization and reflow can be used to replace Cu metal fill with Ru metal fill. The large grain size of the reflowed Ru metal has low electrical resistance that is needed for replacing Cu metal fill in narrow features. It has been shown that Ru metal, with its short effective electron mean free path, is an excellent candidate to meet International Technology Roadmap for Semiconductors (ITRS) resistance requirements as a Cu metal replacement at about 10 nm (5 nm node) minimum feature sizes. Due to many material and electric properties of Ru metal, it is less affected by downward scaling of feature sizes than Cu metal.

The feature can, for example, include a trench or a via. The feature diameter can be less than 30 nm, less than 20 nm, less than 10 nm, or less than 5 nm. The feature diameter can be between 20 nm and 30 nm, between 10 nm and 20 nm, between 5 nm and 10 nm, or between 3 nm and 5 nm. A depth of the feature can, for example be greater 20 nm, greater than 50 nm, greater than 100 nm, or greater than 200 nm. The features can, for example, have an aspect ratio (AR, depth:width) between 2:1 and 20:1, between 2:1 and 10:1, or between 2:1 and 5:1. In one example, the substrate (e.g., Si) includes a dielectric layer and the feature is formed in the dielectric layer.

Figure 1:
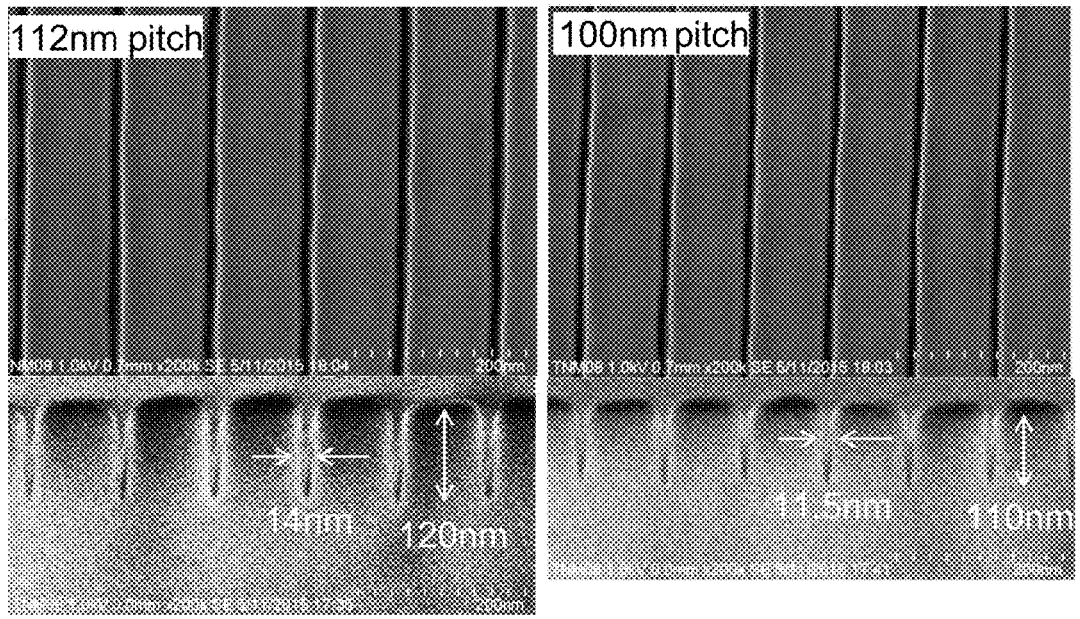
FIG. 1 illustrates dimensions of narrow features in a substrate used for Ru metal fill according to an embodiment of the invention.

FIG. 1 illustrates dimensions of narrow features in a substrate used for Ru metal fill according to an embodiment of the invention. The narrow features were prepared by etching features in a Si substrate and thereafter depositing (backfilling) an oxide layer ($SiO_2$) in the etched features to reduce the diameter of etched features. The etched features had diameters of 50 nm, 56 nm, 64 nm, and 80 nm. The backfilled features had diameters (widths) of about 11.5 nm, about 14 nm, about 17.4 nm, and about 28.5 nm, near the mid-depths of the features.

FIGS. 2A and 2B show cross-sectional and top view SEM images of the features in a substrate used for Ru metal film filling according to an embodiment of the invention. Preparation of the features in the substrate was described in FIG. 1. The features in FIG. 2A had a diameter of about 14 nm, a depth of about 120 nm, an aspect ratio of about 8.5, and a pitch of about 112 nm. The features in FIG. 2B had a diameter of about 11.5 nm, a depth of about 110 nm, an aspect ratio of about 9.5, and a pitch of 100 nm.

FIG. 3A shows cross-sectional SEM images of Ru metal deposition in narrow features in a substrate according to an embodiment of the invention. Preparation of the features in the substrate was described in FIG. 1. The features had diameters of about 11.5 nm, about 17.4 nm, and about 28.5 nm. Prior to Ru metal deposition, a 15 Å thick TaN nucleation layer was deposited in the features using atomic layer deposition (ALD) with alternating exposures of tert-butyl-imido-tris-ethylmethylamido-tantalum (TBTEMT, $Ta(NCMe_3)(NEtMe)_3$) and ammonia ($NH_3$) at a substrate temperature of about 350° C. A conformal Ru metal layer with a thickness of 70 Å was deposited on the TaN nucleation layer by chemical vapor deposition (CVD) using $Ru_3(CO)_{12}$ and CO carrier gas at a substrate temperature of about 200° C. FIG. 3A shows that the features having diameters of 11.5 nm and 17.5 nm were effectively filled with Ru metal, whereas the narrow features having a diameters 28.5 nm were not completely filled and had a void in the upper part of the narrow features.

FIG. 3B shows cross-sectional SEM images of Ru metal deposition in narrow features in a substrate according to an embodiment of the invention. Conformal Ru metal deposition of 150 Å shows that all the features were effectively filled with Ru metal.

Figure 4A:
FIGS. 4A and 4B show cross-sectional SEM images of as-deposited Ru metal layer in features in a substrate according to an embodiment of the invention.
Figure 4B:
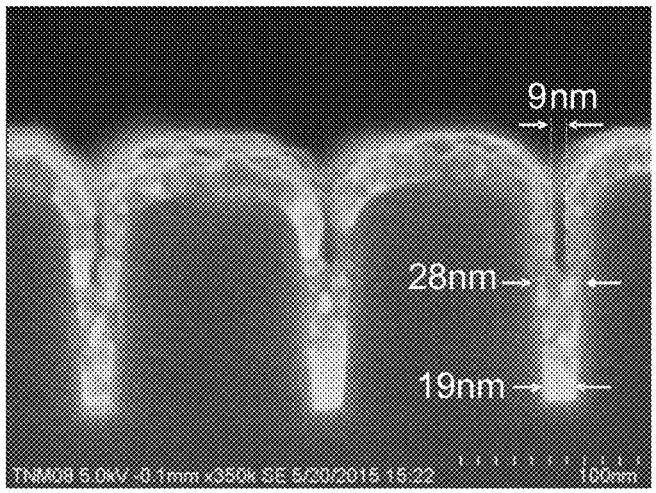

FIGS. 4A and 4B show cross-sectional SEM images of as-deposited Ru metal layer in features in a substrate according to an embodiment of the invention. The Ru metal layer was deposited by CVD using $Ru_3(CO)_{12}$ and CO carrier gas at a substrate temperature of about 200° C., and the features also contained a TaN nucleation layer as described in reference to FIG. 3A. The SEM magnifications in FIGS. 4A and 4B are 200,000 and 350,000, respectively. The ~28 nm wide features at mid-depth are not completely filled but have a void in the Ru metal that is about 9 nm wide near the top of the features.

Figure 5A:
FIGS. 5A and 5B show cross-sectional SEM images of a heat-treated Ru metal layer in features in a substrate according to an embodiment of the invention.
Figure 5B:
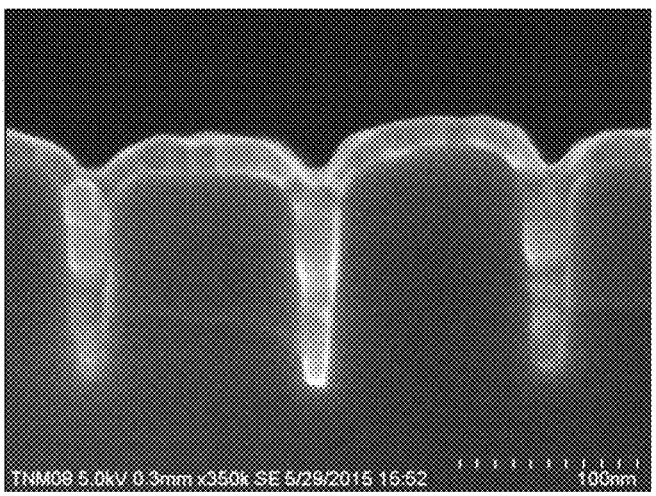

FIGS. 5A and 5B shows cross-sectional SEM images of heat-treated Ru metal in features in a substrate according to an embodiment of the invention. The SEM magnifications in FIGS. 5A and 5B are 200,000 and 350,000, respectively. The as-deposited Ru metal layer was heat-treated at a substrate temperature of 450° C. in the presence of a forming gas for 5 min. FIGS. 5A and 5B show that the heat-treating reflowed the Ru metal in the features to effectively fill the narrow features with Ru metal having large grain sizes, and reduced or eliminated voids in the Ru metal feature fill. The filling takes advantage of capillary action to pull heat-softened Ru metal down into the very narrow features. Further, any Ru metal seam voids in the feature are sealed by the heat-treating.

The structures in FIGS. 5A and 5B may be further processed, for example by performing a planarization process (e.g., chemical mechanical polishing (CMP)) that removes excess Ru metal from above the features.

According to some embodiments, the nucleation layer may be deposited in the features by ALD or CVD prior to the Ru metal fill. The nucleation layer can, for example, include a nitride material. According to one embodiment, the nucleation layer may be selected from the group consisting of Mo, MoN, Ta, TaN, W, WN, Ti, and TiN. A role of the nucleation layer is to provide a good nucleation surface and an adhesion surface for Ru metal in the feature to ensure conformal deposition of the Ru metal layer with a short incubation time. Unlike when using a Cu metal fill, a good barrier layer is not required between the dielectric material and the Ru metal in the features. Therefore, in the case of a Ru metal fill, the nucleation layer can be very thin and may be non-continuous or incomplete with gaps that expose the dielectric material in the features. This allows for increasing the amount of Ru metal in a feature fill compared to a Cu metal feature fill. In some examples, a thickness of the nucleation layer can be 20 Å or less, 15 Å or less, 10 Å or less, or 5 Å or less.

According to some embodiment, the Ru metal layer may be deposited by ALD, CVD, plating, or sputtering. In one example, the Ru metal layer may be deposited by CVD using $Ru_3(CO)_{12}$ and CO carrier gas. However, other Ru metal precursors may be used to deposit the Ru metal layer. In some examples, the Ru metal layer may include a Ru-containing alloy.

According to embodiments of the invention, the Ru metal layer may be deposited at a first substrate temperature and the subsequent heat-treating of the as-deposited Ru metal layer may be carried out at a second substrate temperature that is higher than the first substrate temperature. For example, the heat-treating may be performed at a substrate temperature between 200° C. and 600° C., between 300° C. and 400° C., between 500° C. and 600° C., between 400° C. and 450° C., or between 450° C. and 500° C. Further, the heat-treating may be performed at below atmospheric pressure in the presence of Ar gas, $H_2$ gas, or both Ar gas and $H_2$ gas. In one example, the heat-treating may be performed at below atmospheric pressure in the presence of forming gas. Forming gas is a mixture of $H_2$ and $N_2$. In another example, the heat-treating may be performed under high-vacuum conditions without flowing a gas into a process chamber used for the heat-treating.

According to one embodiment, the heat-treating may be performed in the presence of a gaseous plasma. This allows for lowering the heat-treating temperature compared to when a gaseous plasma is not employed. This allows the use of heat-treating temperatures that are compatible with low-k and ultra-low-k materials. According to some embodiments, the features may be formed in a low-k material with $2.5 \leq k < 3.9$ or an ultra-low-k material with $k < 2.5$. In one example, the gaseous plasma can include Ar gas. The plasma conditions may be selected to include low-energy Ar ions.

According to another embodiment, prior to depositing the Ru metal layer, the substrate may be exposed to a treatment gas that modifies the surfaces in the features and increases the nucleation rate of Ru metal layer in the features. In one example, the treatment gas can include a nitrogen plasma, a $NH_3$ plasma, a $NH_3$ anneal, or a combination thereof. The exposure to the treatment gas can nitride the surfaces in the features. In one example, the treatment gas increases the hydrophilicity of surfaces in the features and thereby increases the nucleation rate of the Ru metal in the feature.

In one example, the opening of a feature may pinch off (close) and a void may form inside the feature before the feature is completely filled with a Ru metal layer. According to one embodiment, the void may be removed by removing excess Ru metal from above the feature, for example by a planarization process, thereby removing the excess Ru metal that caused the pinch off. Thereafter, the heat-treating process may be performed to reflow the Ru metal layer in the feature. According to one embodiment, this may be followed by depositing additional Ru metal layer on reflowed Ru metal layer and repeating the heat-treating process to achieve void-free filling of the feature.

Methods for void-less filling of features such as vias and trenches with low resistivity Ru metal for microelectronic devices have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for at least partially filling a feature in a substrate, the method comprising:
providing a substrate containing a feature;
depositing a ruthenium (Ru) metal layer to at least partially fill the feature; and
heat-treating the substrate to reflow the Ru metal layer in the feature,
wherein the Ru metal layer is deposited at a first substrate temperature and the heat-treating is performed at a second substrate temperature between 200° C. and 600° C. that is greater than the first substrate temperature.

2. The method of claim 1, further comprising:
prior to depositing the Ru metal layer, forming a nucleation layer in the feature.

3. The method of claim 2, wherein the nucleation layer is selected from the group consisting of Mo, MoN, Ta, TaN, W, WN, Ti, and TiN.

4. The method of claim 1, wherein the Ru metal layer is deposited by atomic layer deposition (ALD), chemical vapor deposition (CVD), plating, or sputtering.

5. The method of claim 4, wherein the Ru metal layer is deposited by CVD using $Ru_3(CO)_{12}$ and CO carrier gas.

6. The method of claim 1, wherein the substrate includes a dielectric layer and the feature is formed in the dielectric layer.

7. The method of claim 1, wherein the heat-treating is performed in the presence Ar gas, $H_2$ gas, Ar gas and $H_2$ gas, or $H_2$ gas and $N_2$ gas.

8. The method of claim 1, wherein the second substrate temperature is between 400° C. and 500° C.

9. A method for filling a feature in a substrate, the method comprising:
providing a substrate containing a feature;
depositing a conformal ruthenium (Ru) metal layer that fills the feature; and
heat-treating the substrate to reflow the conformal Ru metal layer in the feature,
wherein the conformal Ru metal layer has seam voids in the feature and the heat-treating seals the seam voids and increases the grain size of the conformal Ru metal layer in the feature, and
wherein the conformal Ru metal layer is deposited at a first substrate temperature and the heat-treating is performed at a second substrate temperature between 200° C. and 600° C. that is greater than the first substrate temperature.

10. The method of claim 9, wherein the second substrate temperature is between 400° C. and 500° C.

11. The method of claim 9, wherein the substrate includes a dielectric layer and the feature is formed in the dielectric layer.

12. The method of claim 9, further comprising:
prior to depositing the conformal Ru metal layer, forming a nucleation layer in the feature.

13. The method of claim 12, wherein the nucleation layer is selected from the group consisting of Mo, MoN, Ta, TaN, W, WN, Ti, and TiN.

14. The method of claim 9, wherein the conformal Ru metal layer is deposited by atomic layer deposition (ALD), chemical vapor deposition (CVD), plating, or sputtering.

15. The method of claim 9, wherein the conformal Ru metal layer is deposited by CVD using $Ru_3(CO)_{12}$ and CO carrier gas.

16. The method of claim 9, wherein the heat-treating is performed in the presence Ar gas, $H_2$ gas, Ar gas and $H_2$ gas, or $H_2$ gas and $N_2$ gas.

17. A method for at least partially filling a feature in a substrate, the method comprising:
providing a substrate containing a feature;

depositing a ruthenium (Ru) metal layer to at least partially fill the feature, wherein depositing the Ru metal layer pinches off a feature opening before the feature is filled with the Ru metal layer, thereby forming a void inside the feature;
removing excess Ru metal that caused the pinch off; and
thereafter, depositing additional Ru metal in the feature, wherein the Ru metal layer and the additional Ru metal are deposited by CVD using $Ru_3(CO)_{12}$ and CO carrier gas.

18. The method of claim 17, further comprising:
prior to depositing the Ru metal layer, forming a nucleation layer in the feature, wherein the nucleation layer is selected from the group consisting of Mo, MoN, Ta, TaN, W, WN, Ti, and TiN.

19. The method of claim 17, wherein the removing the excess Ru metal includes a planarization process.

\* \* \* \* \*